United States Patent
Keto

(10) Patent No.: US 10,214,813 B2
(45) Date of Patent: Feb. 26, 2019

(54) APPARATUS AND METHOD FOR PROVIDING A COATING TO A SURFACE OF A SUBSTRATE

(71) Applicant: BENEQ OY, Espoo (FI)

(72) Inventor: Leif Keto, Espoo (FI)

(73) Assignee: BENEQ OY, Espoo (FI)

(*) Notice: Subject to any disclaimer, the term of this patent is extended or adjusted under 35 U.S.C. 154(b) by 0 days.

(21) Appl. No.: 15/751,566

(22) PCT Filed: Aug. 30, 2016

(86) PCT No.: PCT/FI2016/050592
§ 371 (c)(1),
(2) Date: Feb. 9, 2018

(87) PCT Pub. No.: WO2017/037338
PCT Pub. Date: Mar. 9, 2017

(65) Prior Publication Data
US 2018/0237913 A1    Aug. 23, 2018

(30) Foreign Application Priority Data
Sep. 2, 2015   (FI) .......... 20155629

(51) Int. Cl.
C23C 16/00    (2006.01)
C23C 16/455   (2006.01)
C23C 16/54    (2006.01)

(52) U.S. Cl.
CPC ...... *C23C 16/45544* (2013.01); *C23C 16/545* (2013.01)

(58) Field of Classification Search
CPC .......... C23C 16/45544; C23C 16/545
See application file for complete search history.

(56) References Cited

U.S. PATENT DOCUMENTS
2011/0045349 A1    2/2011   Pushparaj et al.

FOREIGN PATENT DOCUMENTS
WO    WO 2008/096510 A1 *   8/2008
WO    WO-2008096510 A1     8/2008

OTHER PUBLICATIONS

Dickey, E, Progress in Roll to Roll Atomic Layer Deposition, Lotus Applied Technology, Council fro Chemical Research Barrier Workshop, Arlington, Virginia, Sep. 2012. (Year: 2012).*

(Continued)

*Primary Examiner* — Kelly M Gambetta
(74) *Attorney, Agent, or Firm* — Robert P. Michal, Esq.; Carter, DeLuca, Farrell & Schmidt, LLP

(57) ABSTRACT

The invention relates to an apparatus and to a method for providing an ALD coating to a surface of a substrate. The apparatus includes at least one ALD coating unit for coating the surface of the substrate, a first reel for unwinding the substrate to be coated, a second reel for rewinding the coated substrate, one or more primary support structures provided on the same side of the substrate as the surface to be coated or the coated surface for forming a substrate transport path from the first reel through the at least one primary support structure to the second reel, and an interleave web in connection with each of the one or more primary support structures.

18 Claims, 4 Drawing Sheets

(56) References Cited

OTHER PUBLICATIONS

International Search Report issued by the Finnish Patent and Registration Office acting as the International Searching Authority in relation to International Application No. PCT/FI2016/050592 dated Dec. 23, 2016 (4 pages).
Written Opinion of the International Searching Authorirty issued by the Finnish Patent and Registration Office acting as the International Searching Authority in relation to International Application No. PCT/FI2016/050592 dated Dec. 23, 2016 (5 pages).

* cited by examiner

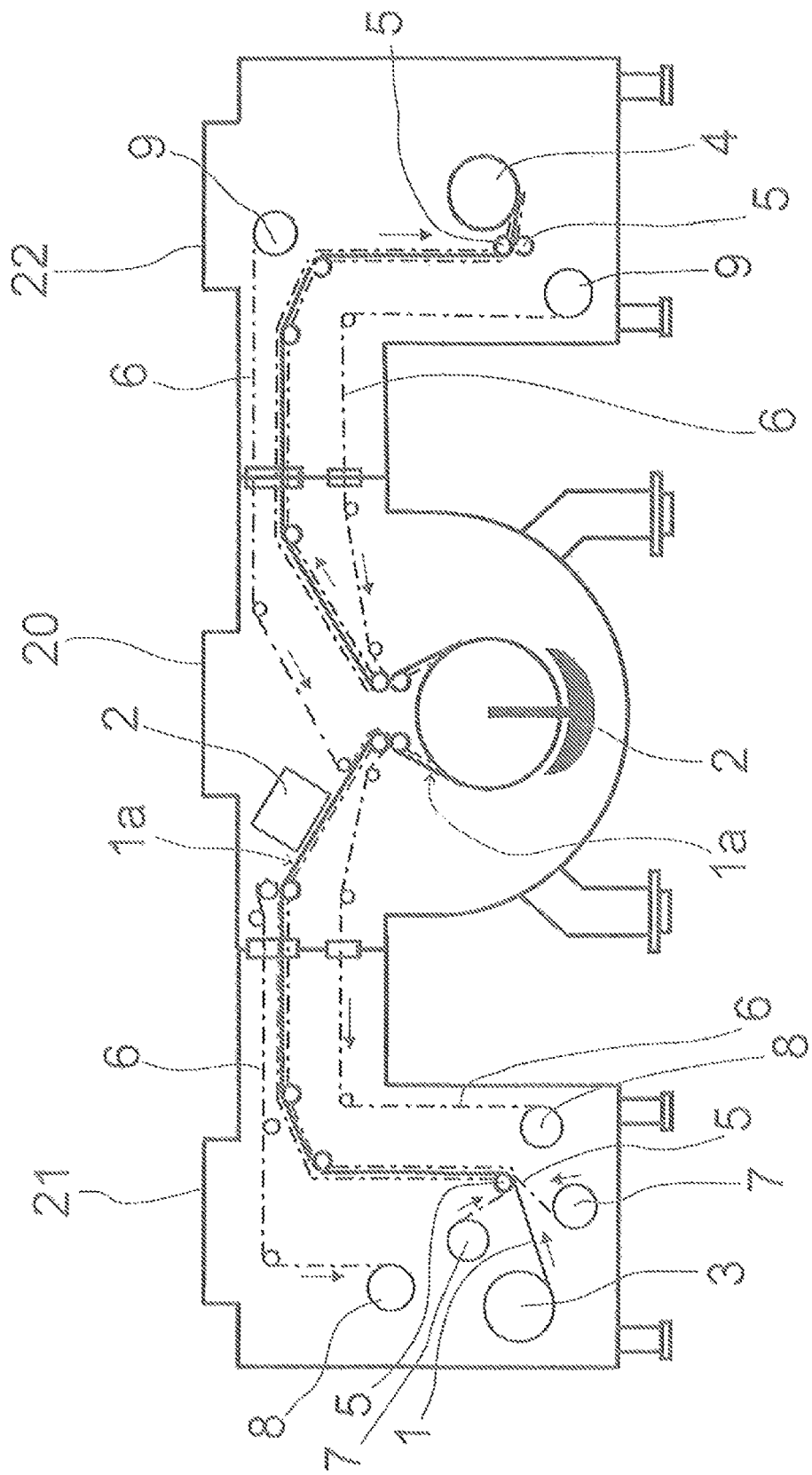

APPARATUS AND METHOD FOR PROVIDING A COATING TO A SURFACE OF A SUBSTRATE

CROSS-REFERENCE TO RELATED APPLICATIONS

This application is a National Phase Entry under 35 USC § 371 of PCT Patent Application Serial No. PCT/FI2016/050592 filed Aug. 30, 2016, which claims priority to Finnish Patent Application No. 20155629 filed Sep. 2, 2015, the disclosure of each of these applications is expressly incorporated herein by reference in their entirety.

FIELD OF THE INVENTION

The present invention relates to an apparatus for providing a coating to a surface of a substrate. The present invention further relates to a method for providing a coating to a surface of a substrate in a coating unit.

BACKGROUND OF THE INVENTION

In the prior art several types of apparatuses are used for coating a surface of a substrate. When the substrate is coated in a roll-to-roll apparatus the substrate needs to be transferred along a transport path which comprises rollers or other types of guiding elements. The surface of the substrate on which the coating is applied may in some cases be so sensitive that transportation through the path may contaminate or otherwise harm the surface before the coating is applied or the coated surface may be destroyed by the guiding elements.

In the prior art several types of apparatuses, and nozzle heads are used for subjecting a surface of a substrate to successive surface reactions of at least a first precursor and a second precursor according to the principles of atomic layer deposition method (ALD). In ALD applications, typically two gaseous precursors are introduced into the ALD reactor in separate stages. The gaseous precursors effectively react with the substrate surface, resulting in deposition of a single atomic layer. The precursor stages are typically followed or separated by a purge stage that eliminates the excess precursor from the surface of the substrate prior to the separate introduction of the other precursor. Therefore an ALD process requires alternating in sequence the flux of precursors to the surface of the substrate. This repeated sequence of alternating surface reactions and purge stages between is a typical ALD deposition cycle.

When making sensitive coatings, for example high quality barrier films, it is very important not to touch the clean side of the substrate before coating is applied or the coated surface after the coating. In this application ALD-head is an example of a deposition head. Other possible deposition and surface modification methods and deposition heads comprise CVD-coatings and related heads, PVD-coating and related heads, sputtering coating and related heads, aerosol coatings and related heads, or coatings effectuated by high energy zone like flame or plasma, and related heads. This invention relates especially to a roll-to-roll application, in which the substrate to be coated is arranged in a first roll that is unwound and transferred through at least one coating unit in which the coating is applied to the surface of the substrate and finally the substrate web is rewound to a second roll. Making a transport path in a roll-to-roll apparatus where a substrate is transferred from the unwinder roll to the rewinder roll without the clean side of the substrate or the coated side of the substrate facing any support structures is basically impossible.

BRIEF DESCRIPTION OF THE INVENTION

An object of the present invention is thus to provide an apparatus and a method so as to solve the above problems, i.e. the problem with the support structure touching the clean surface or the coated surface of the substrate. The objects of the invention are achieved by an apparatus and a method which are characterized by what is stated in the independent claims. The preferred embodiments of the invention are disclosed in the dependent claims.

The invention is based on the idea of providing an interleave web between the substrate and the primary support structures facing the clean side of the substrate and/or the coated side of the substrate for protecting the substrate to be in contact with the primary support structure. The interleave web is used all the way of the transport path where the clean surface or the coated surface of the substrate faces the primary support structure. The primary support structure is the support structure that is arranged on the same side of the substrate as the surface to be coated. The support structure that is arranged on the other side of the substrate than the surface to be coated is called in this application a secondary support structure.

According to the invention the apparatus for providing a coating to a surface of a substrate comprises at least one ALD coating unit for coating the surface of the substrate; a first reel for unwinding the substrate to be coated; a second reel for rewinding the coated substrate; one or more primary support structures provided on the same side of the substrate as the surface to be coated or the coated surface for forming a substrate transport path from the first reel through the at least one primary support structure to the second reel; and an interleave web in connection with each of the one or more primary support structures. The interleave web is arranged to protect the surface to be coated or the coated surface when the substrate is passing through the one or more primary support structures. The interleave web is arranged to move together with the substrate along at least part of the substrate transport path and the interleave web is arranged between each of the one or more primary support structures and the surface to be coated or the coated surface such that the surface to be coated or the coated surface is arranged to contact only with the interleave web along the substrate transport path from the first reel to the second reel.

According one embodiment of the invention the apparatus for providing a coating to a surface of a substrate is subjecting the surface of the substrate to successive surface reactions of at least a first precursor and a second precursor according to principles of atomic layer deposition in order to provide a coating on the surface of the substrate.

According to the invention the coating unit is a vapour phase coating unit or an ALD-coating unit in which the surface of the substrate is subjected to successive surface reactions of at least a first precursor and a second precursor according to principles of atomic layer deposition.

According to the invention the method for providing a coating to a surface of substrate in a coating unit comprises the steps of forming a transport path from a first reel to a second reel by arranging one or more primary support structures on the same side of the substrate as the surface to be coated or the coated surface; transporting the substrate from the first reel to the second reel along the transport path and through at least one coating unit; arranging an interleave web in connection with each of the one or more primary support structures for protecting the surface to be coated or the coated surface when the substrate is passing through the one or more primary support structures such that the interleave web is arranged between each of the one or more primary support structures and the surface to be coated or the coated surface such that the surface to be coated or the coated surface is arranged to contact only with the interleave web along the substrate transport path from the first reel to the second reel, and arranging said interleave web to move together with the substrate.

According to one embodiment of the invention the method for providing a coating to a surface of a substrate comprises a step of subjecting the surface of the substrate to successive surface reactions of at least a first precursor and a second precursor according to principles of atomic layer deposition in order to provide a coating on the surface of the substrate.

According to the invention the method comprises a step of coating the surface of the substrate by the coating unit which is a vapour phase coating unit or an ALD-coating unit in which the coating is provided on the surface of the substrate by subjecting the surface of the substrate to successive surface reactions of at least a first precursor and a second precursor according to principles of atomic layer deposition.

An advantage of the apparatus and the method of the invention is that a high quality barrier, i.e. coating for the substrate can be achieved and the primary support structures of the apparatus stay clean after the coating is applied to the surface so the need for maintenance of the apparatus because the primary support structures do not touch the coated substrate. Instead, the coated substrate is guarded by the interleave web.

BRIEF DESCRIPTION OF THE DRAWINGS

In the following the invention will be described in greater detail by means of preferred embodiments with reference to the attached drawings, in which
FIG. 4 shows still another embodiment of the invention.

DETAILED DESCRIPTION OF THE INVENTION

Figure 1:
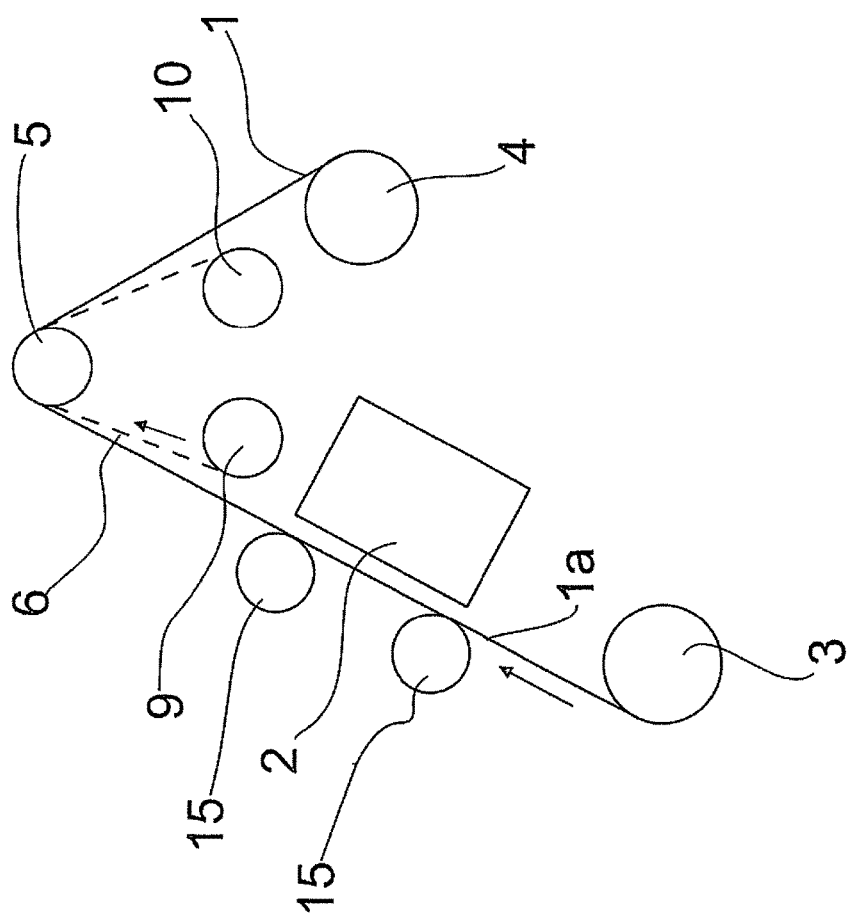
FIG. 1 shows one embodiment of the invention.

FIG. 1 shows one example of an embodiment of the apparatus according to the invention which comprises at least one coating unit 2 for coating the surface 1a of the substrate 1, and in this particular example the apparatus comprises only one coating unit 2. The apparatus further comprises a first reel 3 for unwinding the substrate 1 to be coated; a second reel 4 for rewinding the coated substrate 1; one or more primary support structures 5, in this example only one, provided on the same side of the substrate 1 as the surface 1a to be coated or the coated surface 1a for forming a substrate transport path from the first reel 3 through the at least one primary support structure 5 to the second reel 4; and an interleave web 6 in connection with each of the one or more primary support structures 5, said interleave web 6 is arranged to protect the surface 1a to be coated or the coated surface 1a when the substrate 1 is passing through the one or more primary support structures 5. The interleave web 6 is arranged to move together with the substrate 1 at least part of the transport path and the interleave web 6 is arranged between each of the one or more primary support structures 5 and the surface 1a to be coated or the coated surface 1a such that the surface 1a to be coated or the coated surface 1a is arranged to contact only with the interleave web 6 along the substrate transport path from the first reel 3 to the second reel 4. The primary support structure 5 can be a roller or any other type of support structure suitable for transporting a substrate and an interleave web. The coating unit 2 is preferably a nozzle head or a deposition chamber.

According to the invention the apparatus may also comprise multiple coating units. The substrate is unwound from the first reel 3 and rewound to the second reel 4 after the coating is applied to the surface 1a of the substrate 1 in the coating unit 2. In the example shown in FIG. 1 the transport path of the substrate 1 is so short that only one primary support structure 5 is needed and this is arranged after the coating unit 2. In this example the uncoated substrate does not need to be supported before the coating unit 2 from the same side on which the coating will be applied but it is supported from the other side of the substrate, i.e. from the side on which the coating is or will not be applied. These support structures that are arranged on the other side of the substrate 1 than the surface 1a to be coated or the coated surface 1a are called secondary support structures 15. In this embodiment an interleave web 6 is provided between the surface 1a that is coated and the primary support structure 5 such that the interleave web 6 is unwound from a secondary interleave unwinding reel 9 and rewound after the primary support structure 5 to a secondary interleave rewinding reel 10. In this application for the sake of clarity the interleave unwinding reel that is arranged before the coating unit 2 is called a primary interleave unwinding reel and the interleave unwinding reel that is arranged after the coating unit 2 is called a secondary interleave unwinding reel. Further the interleave rewinding reel that is arranged before the coating unit 2 is called a primary interleave rewinding reel and the interleave rewinding reel that is arranged after the coating unit 2 is called a secondary interleave rewinding reel. So in this embodiment the apparatus comprises one or more secondary interleave unwinding reels 9 comprising the interleave web 6 for unwinding the interleave web 6, said one or more secondary interleave unwinding reels 9 are arranged such that the interleave web 6 is brought together with the substrate 1 after the coating unit 2 and before or at the first primary support structure 5 after the coating unit 2. The apparatus also comprises one or more secondary interleave rewinding reels 10 for rewinding the interleave web 6 after a separation from the substrate 1 that happens after the coating unit 2. The arrows in FIG. 1 show the primary moving direction of the substrate 1 and the primary moving direction of the interleave web 6. It is also possible to move the substrate and the interleave webs back and forth periodically so that the web moves somewhat more in the primary moving direction than in the opposite direction in each of the periods. Although in the embodiment shown in FIG. 1 the interleave web 6 is used in connection with the coated substrate 1 the interleave web 6 can also be used in connection with the uncoated substrate 1 such that a primary interleave unwinding reel is arranged to unwind the interleave web 6 so that it is brought together with the substrate 1 before the coating is applied and also separated from the substrate 1 before the coating is applied and further rewound to a primary interleave rewinding reel.

Figure 2:
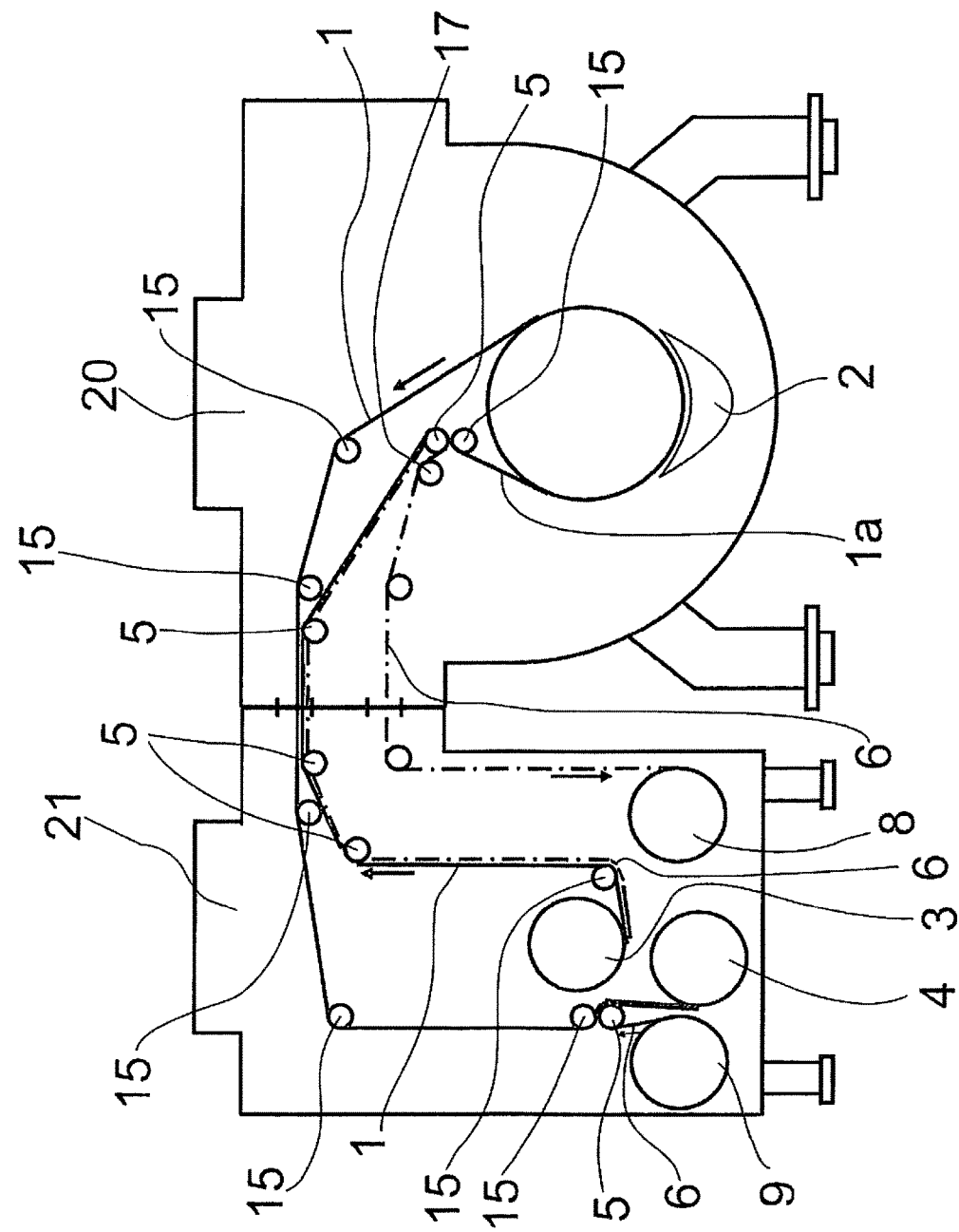
FIG. 2 shows another embodiment of the invention.

FIG. 2 shows one example of an embodiment of the apparatus according to the invention which comprises at least one coating unit 2 for subjecting the surface 1a of the substrate 1 to at least the first precursor and the second precursor, and in this particular example the apparatus comprises only one coating unit 2. The apparatus further comprises a first reel 3 for unwinding the substrate 1 to be coated; a second reel 4 for rewinding the coated substrate 1; one or more primary support structures 5 provided on the same side of the substrate 1 as the surface 1a to be coated or the coated surface 1a for forming a substrate transport path from the first reel 3 through the at least one primary support structure 5 to the second reel 4; and an interleave web 6 in connection with each of the one or more primary support structures 5, said interleave web 6 is arranged to protect the surface 1a to be coated or the coated surface 1a when the substrate 1 is passing through the one or more primary support structures 5. The interleave web 6 is arranged to move together with the substrate 1 at least part of the transport path and the interleave web 6 is arranged between each of the one or more primary support structures 5 and the surface 1a to be coated or the coated surface 1a such that the surface 1a to be coated or the coated surface 1a is arranged to contact only with the interleave web 6 along the substrate transport path from the first reel 3 to the second reel 4. The arrows show the primary moving direction of the substrate and the interleave webs. It is also possible to move the substrate and the interleave webs back and forth periodically so that the web moves somewhat more in the primary moving direction than in the opposite direction in each of the periods.

The FIG. 2 which shows an embodiment of the apparatus according to the invention in which the interleave web 6 is arranged to the first reel 3 together with the substrate 1 such that the interleave web 6 and the substrate 1 are unwound together from the first reel 3. The interleave web 6 travels together with the substrate through the primary support structures 5 along the transport path before the coating unit 2 and the interleave web 6 is arranged to protect the surface 1a to be coated until a separation from the substrate 1 before the coating unit 2 is arranged with a separation element 17. If needed the interleave web is also arranged to protect the coated surface 1a after the coating unit 2. The separation element 17 is in this example a roller after the last primary support structure 5 before the coating unit 2. The apparatus according to the invention further comprises one or more primary interleave rewinding reels 8 for rewinding the interleave web 6 after a separation from the substrate 1 before the coating unit 2 so in this example the interleave web 6 is rewound to the primary interleave rewinding reel 8 after the separation from the substrate 1. After the coating is applied to the surface 1a of the substrate 1 in the coating unit 2 the substrate 1 further moves along the transport path. The transport path is arranged in this example such that the substrate 1 is supported by the secondary support structures 15 on the side which is not coated and just before the substrate 1 is rewound to the second reel 4 one primary support structure 5 is provided for turning the transport path. With this primary support structure 5 an interleave web 6 is provided so the apparatus further comprises a secondary interleave unwinding reel 9 comprising the interleave web 6 for unwinding the interleave web 6. The secondary interleave unwinding reel 9 is arranged such that the interleave web 6 is brought together with the substrate 1 after the coating unit 2 and before or at the first primary support structure 5 after the coating unit 2. In this example the interleave web is brought together with the substrate 1 at the primary support structure 5. After the last primary support structure 5 the second reel 4 is arranged to rewind both the coated substrate 1 and the interleave web 6.

According to the invention the coating unit 2 is arranged in a first chamber 20 and the first reel 3 and the second reel 4 are arranged in a second chamber 21, said chambers 20, 21 are arranged in an operational connection with each other such that the substrate 1 with or without the interleave web 6 is movable from the first chamber 20 to the second chamber 21 and vice versa. The chambers 20, 21 are connected also such that the interleave web 6 alone is movable between the chambers 20, 21. In this embodiment of the invention the coating unit 2 is arranged in the first chamber 20 which is a main chamber and the first and the second reel 3, 4 are arranged in the second chamber 21 called a side chamber. This is particularly advantageous because the maintenance work and the change of the reels can be organized without the need to open the main chamber comprising the coating unit.

Figure 3:
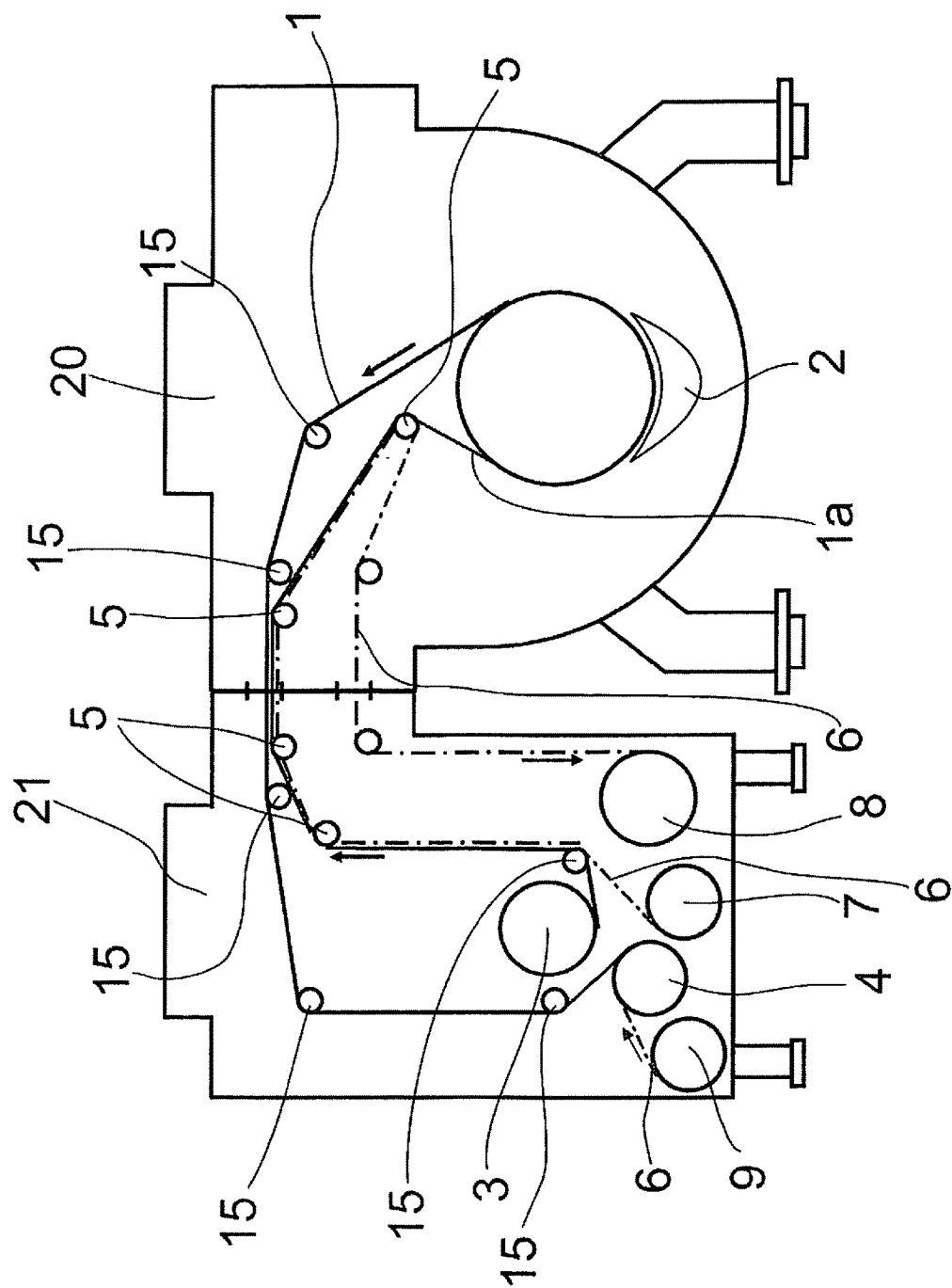
FIG. 3 shows yet another embodiment of the invention.

FIG. 3 shows yet another embodiment of the invention in which the apparatus comprises at least one coating unit 2 for subjecting the surface 1a of the substrate 1 to at least the first precursor and the second precursor, and in this particular example the apparatus comprises only one coating unit 2. The apparatus further comprises a first reel 3 for unwinding the substrate 1 to be coated; a second reel 4 for rewinding the coated substrate 1; one or more primary support structures 5 provided on the same side of the substrate 1 as the surface 1a to be coated or the coated surface 1a for forming a substrate transport path from the first reel 3 through the at least one primary support structure 5 to the second reel 4; and an interleave web 6 in connection with each of the one or more primary support structures 5, said interleave web 6 is arranged to protect the surface 1a to be coated or the coated surface 1a when the substrate 1 is passing through the one or more primary support structures 5. The interleave web 6 is arranged to move together with the substrate 1 and the interleave web 6 is arranged between each of the one or more primary support structures 5 and the surface 1a to be coated or the coated surface 1a such that the surface 1a to be coated or the coated surface 1a is arranged to contact only with the interleave web 6 along the substrate transport path from the first reel 3 to the second reel 4. The arrows show the primary moving direction of the substrate and the interleave webs. It is also possible to move the substrate and the interleave webs back and forth periodically so that the web moves somewhat more in the primary moving direction than in the opposite direction in each of the periods.

In the embodiment shown in FIG. 3 the apparatus further comprises a primary interleave unwinding reel 7 comprising the interleave web 6 for unwinding the interleave web 6. The primary interleave unwinding reel 7 is arranged such that the interleave web 6 is brought together with the substrate 1 supplied from the first reel 3 before or at the first primary support structure 5 in which the interleave web 6 is arranged between the surface 1a to be coated and the primary support structure 5. The apparatus may comprise one or more primary interleave unwinding reels 7. In this figure the interleave web 6 is brought together with the substrate 1 before the first primary support structure 5 so that the interleave web 6 and the substrate 1 travel together along the transport path before the first primary support structure and at the first primary support structure the interleave web 6 goes between the substrate 1 and the primary support structure 5. The substrate 1 is unwound from the first reel 3 and after joining together the substrate 1 and the interleave web 6 move together toward the coating unit 2 and just before the coating unit 2 after the last primary support structure 5 the interleave web is arranged to change the transport path to move toward a primary interleave rewinding reel 8 for rewinding the interleave web 6 after the separation from the substrate 1 before the coating unit 2. So the interleave web 6 is arranged to protect the surface 1a to be coated until a separation from the substrate 1 before the coating unit 2 and then rewound to the primary interleave rewinding reel 8.

The surface 1a of the substrate 1 is coated in the coating unit 2 and after that it moves such that the substrate 1 is supported by the secondary support structures 15 on the side of the substrate 1 which is not coated. Before the substrate 1 is rewound to the second reel 4 an interleave web 6 is provided together with the substrate 1. The apparatus therefore further comprises a secondary interleave unwinding reel 9 comprising the interleave web 6 for unwinding the interleave web 6. The secondary interleave unwinding reel 9 is arranged such that the interleave web 6 is brought together with the substrate 1 after the coating unit 2. The second reel 4 is arranged to rewind both the coated substrate 1 and the interleave web 6.

In this embodiment shown in FIG. 3 the apparatus is also divided into a first chamber 20 and a second chamber 21 which the first chamber comprises the coating unit 2 and the second chamber 21 comprises the first reel 3 and the second reel 4 as well as the reels for the interleave web 6.

In the method according to the invention the method comprises the steps of forming a transport path from a first reel 3 to a second reel 4 by arranging one or more primary support structures 5 on the same side of the substrate 1 as the surface 1a to be coated or the coated surface 1a; transporting the substrate 1 from the first reel 3 to the second reel 4 along the transport path and through at least one coating unit 2; arranging an interleave web 6 in connection with each of the one or more primary support structures 5 for protecting the surface 1a to be coated or the coated surface 1a when the substrate 1 is passing through the one or more primary support structures 5 such that the interleave web 6 is arranged between each of the one or more primary support structures 5 and the surface a to be coated or the coated surface 1a such that the surface 1a to be coated or the coated surface 1a is arranged to contact only with the interleave web 6 along the substrate transport path from the first reel 3 to the second reel 4, and arranging said interleave web 6 to move together with the substrate 1.

In the method the step of forming a transport path comprises a step of forming the transport path from the first reel 3 arranged in the second chamber 21 through the coating unit 2 arranged in the first chamber to the second reel 4 arranged in the second chamber 21.

The method may comprise a step of arranging the interleave web 6 to the first reel 3 together with the substrate 1; and a step of unwinding the interleave web 6 and the substrate 1 simultaneously from the first reel 3.

The method may comprise a step of separating the interleave web 6 from the substrate 1 before the coating unit 2 with a separation element 17; and a step of rewinding the interleave web 6 to one or more primary interleave rewinding reels 8.

The method may comprise a step of arranging the interleave web 6 together with the substrate at the first primary support structure 5 after the coating unit 2.

The method may comprise a step of rewinding the substrate 1 and the interleave web 6 together to the second reel 4.

The method may comprise a step of arranging the coating unit 2 in a first chamber 20; a step of arranging the first reel 3 and the second reel 4 in a second chamber 21; and a step of arranging the first chamber 20 and the second chamber 21 in operational connection together for moving the substrate 1 and/or the interleave web 6 between the first and the second chamber 20, 21.

For first and second precursors, radicals generated by plasma can also be utilized.

FIG. 4 shows an embodiment of the invention in which both surfaces 1a of the substrate 1 are coated. In this embodiment of the invention the apparatus comprises two coating units 2 for coating the surface 1a of the substrate 1; said coating units 2 are arranged along the transport path such that first one surface 1a of the substrate 1 is coated and then the opposite surface 1a of the substrate 1 is coated which means that both surfaces 1a of the substrate are coated. The apparatus comprises a first reel 3 for unwinding the substrate 1 to be coated, a second reel 4 for rewinding the coated substrate 1, primary support structures 5 provided on the same side of the substrate 1 as the surface 1a to be coated or the coated surface 1a for forming a substrate transport path from the first reel 3 through the at least one primary support structure 5 to the second reel 4. In this embodiment as both surfaces 1a are coated all the support structures 5 forming the substrate transport path are primary support structures 5. The apparatus further comprises an interleave web 6 in connection with each of the one or more primary support structures 5, which said interleave web 6 is arranged to protect the surface 1a to be coated or the coated surface 1a when the substrate 1 is passing through the one or more primary support structures 5. Said interleave web 6 is arranged to move together with the substrate 1 and it is arranged between each of the one or more primary support structures 5 and the surface 1a to be coated or the coated surface 1a such that the surface 1a to be coated or the coated surface 1a is arranged to contact only with the interleave web 6 along the substrate transport path from the first reel 3 to the second reel 4. As the both sides of the substrate 1 are coated there are interleave webs 6 on both sides of the substrate 1 as well.

FIG. 4 shows that the substrate in unwound from the first reel 3 and before the first primary support structure 5 the interleave web 6 is arranged between the primary support structure 5 and the substrate 1. As both surfaces 1a of the substrate 1 are coated the interleave web 6 is brought together with the substrate before or at the first primary support structure 5 on each side of the substrate 1. The apparatus comprises two coating units 2 such that first one surface 1a of the substrate 1 is coated and then the other. Before the first coating unit 2 the interleave web 6 that protects the surface to be coated on the first coating unit 2 is arranged to be separated from the substrate 1 and directed toward the primary interleave rewinding reel 8. After the coating is applied to the surface 1a of the substrate 1a second interleave web 6 is unwound from a secondary interleave unwinding reel 9 and arranged on the coated surface 1a of the substrate to protect it before the substrate 1 travels to the second coating unit 2. The surface 1a which is not coated on the first coating unit 2 is also protected with an interleave web 6 which is separated from the substrate 1 before the second coating unit 2 and rewound to an own primary interleave rewinding reel 8. The second coating unit 2 provides a coating on that surface 1a of the substrate which is not coated in the first coating unit 2 and the other surface 1a of the substrate 1 which is already coated in the first coating unit 2 is protected with the interleave web 6. After the second coating unit 2 an interleave web 6 is unwound from a secondary interleave unwinding reel 9 and brought together with the surface 1a of the substrate 1 coated in the second coating unit 2 so that both surfaces 1a of the substrate 1 are protected with an interleave web 6. The second reel 4 is arranged to rewind the substrate 1 that is coated on both surfaces 1a and both interleave webs 6. The embodiment of the invention shown in FIG. 4 comprises three chambers 20, 21, 22, i.e. one main chamber and two side chambers. The first and the second coating units 2 are arranged in the first chamber 20 which is the main chamber. The first reel 3, the primary interleave unwinding reels 7 and the primary interleave rewinding reels 8 are arranged in the second chamber 21, which is a side chamber. The second reel 4 and the secondary interleave unwinding reels 9 are arranged in the third chamber 22, which is also a side chamber. The configuration of the chambers can also be arranged such that there is the main chamber in which the coating units 2 are arranged and then there is only one side chamber in which the first reel 3, the second reel 4, the primary unwinding reels 7, the primary interleave rewinding reels 8 and the secondary interleave unwinding reels 9 all are arranged.

As shown in FIG. 4 in this embodiment the interleave web 6 is arranged to protect the surface 1a to be coated until a separation from the substrate 1 before the coating unit 2 is arranged and also to protect the coated surface 1a after the coating unit 2. This is because of the transport path configuration but in some cases it may be that the interleave web 6 is arranged to protect the surface 1a to be coated until a separation from the substrate 1 before the coating unit 2 is arranged or to protect the coated surface 1a after the coating unit 2.

As can be seen from the figure the separation from the substrate can be arranged with a separation element that is arranged after the last primary support structure before the coating unit and the separation element can be a roller or the separation may be arranged otherwise.

The side chambers may also comprise all kinds of pre- or after treatment devices for the substrate 1 such as tacky rolls for cleaning the surface of the substrate from particles, IR heaters for removing moisture, plasma for pre-treating the substrate, pre-deposition with polymer or after deposition, etc. A tacky roll comprises at least one roller to lift the contamination from the web and transfers it to a semi-adhesive, that is, tacky, roll. This locks the contaminant down and removes it from the process, instead of letting it slip back into the production line.

The advantage of the side chambers 21, 22 is that the substrate reels have to be changed and this brings air and moisture inside the chamber. Because the main chamber 20 is isolated from the side chambers 21, 22 it can be kept under vacuum or under a certain temperature which improves and speeds up the process.

The interleave web 6 may be sticky which means that it engages to the surface 1a of the substrate 1 and has to be separated from the surface 1a of the substrate 1 with a lay-off roll or the interleave web 6 may be such that it does not engage with the surface 1a of the substrate 1 and there is no need for a separate lay-off roll to separate the interleave web 6 from the surface 1a of the substrate 1.

It will be obvious to a person skilled in the art that, as the technology advances, the inventive concept can be implemented in various ways. The invention and its embodiments are not limited to the examples described above but may vary within the scope of the claims.

The invention claimed is:

1. An apparatus for providing a coating to a surface of a substrate, the apparatus comprising:
    at least one ALD-coating unit in which the surface of the substrate is subjected to successive surface reactions of at least a first precursor and a second precursor according to principles of atomic layer deposition for coating the surface of the substrate;
    a first reel for unwinding the substrate to be coated;
    a second reel for rewinding the coated substrate;
    one or more primary support structures provided on the same side of the substrate as the surface to be coated or the coated surface for forming a substrate transport path from the first reel through the at least one primary support structure to the second reel;
    an interleave web in connection with each of the one or more primary support structures, said interleave web is arranged to protect the surface to be coated or the coated surface when the substrate is passing through the one or more primary support structures, said interleave web is arranged to move together with the substrate along at least part of the substrate transport path, the interleave web is arranged between each of the one or more primary support structures and the surface to be coated or the coated surface such that the surface to be coated or the coated surface is arranged to contact only with the interleave web along the substrate transport path from the first reel to the second reel; and
    one or more primary interleave unwinding reels comprising the interleave web for unwinding the interleave web, said one or more primary interleave unwinding reels is arranged such that the interleave web is brought together with the substrate supplied from the first reel before or at the first primary support structure in which the interleave web is arranged between the surface to be coated and the primary support structure.

2. The apparatus according to claim 1, wherein the interleave web is arranged to the first reel together with the substrate such that the interleave web and the substrate are unwound together from the first reel.

3. The apparatus according to claim 1, wherein the interleave web is arranged to protect the surface to be coated until a separation from the substrate before the coating unit is arranged or to protect the coated surface after the coating unit.

4. The apparatus according to claim 3, wherein the separation from the substrate is arranged with a separation element that is arranged after the last primary support structure before the coating unit.

5. The apparatus according to claim 4, wherein the separation element is a roller.

6. The apparatus according to claim 1, wherein the apparatus further comprises:
    one or more primary interleave rewinding reels for rewinding the interleave web after a separation from the substrate before the coating unit.

7. The apparatus according to claim 1, wherein the apparatus further comprises:
    one or more secondary interleave unwinding reels comprising the interleave web for unwinding the interleave web, said one or more secondary interleave unwinding reels are arranged such that the interleave web is brought together with the substrate after the coating unit and before or at the first primary support structure after the coating unit.

8. The apparatus according to claim 1, wherein the apparatus comprises:
    one or more secondary interleave rewinding reels for rewinding the interleave web after a separation from the substrate after the coating unit.

9. The apparatus according to claim 1, wherein the second reel is arranged to rewind both the coated substrate and the interleave web.

10. The apparatus according to claim 1, wherein the coating unit is arranged in a first chamber and the first reel and the second reel are arranged in a second chamber, said chambers are arranged in operational connection with each other such that the substrate with or without the interleave web is movable from the second chamber to the first chamber and vice versa.

11. The apparatus according to claim 1, wherein the primary support structure is a roller.

12. The apparatus according to claim 1, wherein the coating unit is a nozzle head or a deposition chamber.

13. A method for providing a coating to a surface of a substrate in a coating unit, the method comprising:
 coating the surface of the substrate by the coating unit which is an ALD-coating unit in which the coating is provided on the surface of the substrate by subjecting the surface of the substrate to successive surface reactions of at least a first precursor and a second precursor according to principles of atomic layer deposition;
 forming a transport path from a first reel to a second reel by arranging one or more primary support structures on the same side of the substrate as the surface to be coated or the coated surface;
 transporting the substrate from the first reel to the second reel along the transport path and through at least one coating unit;
 arranging an interleave web in connection with each of the one or more primary support structures for protecting the surface to be coated or the coated surface when the substrate is passing through the one or more primary support structures such that the interleave web is arranged between each of the one or more primary support structures and the surface to be coated or the coated surface such that the surface to be coated or the coated surface is arranged to contact only with the interleave web along the substrate transport path from the first reel to the second reel, and arranging said interleave web to move together with the substrate; and
 arranging the interleave web together with the substrate supplied from the first reel before or at the first primary support structure in which the interleave web is arranged between the surface to be coated and the primary support structure.

14. The method according to claim 13, wherein the method further comprises the steps of:
 arranging the interleave web to the first reel together with the substrate; and
 unwinding the interleave web and the substrate simultaneously from the first reel.

15. The method according to claim 13, wherein the method further comprises the steps of:
 separating the interleave web from the substrate before the coating unit with a separation element; and
 rewinding the interleave web to one or more primary interleave rewinding reels.

16. The method according to claim 13, wherein the method further comprises the step of:
 arranging the interleave web together with the substrate at the first primary support structure after the coating unit.

17. The method according to claim 13, wherein the method further comprises the step of:
 rewinding the substrate and the interleave web together to the second reel.

18. The method according to claim 13, wherein the method further comprises the steps of:
 arranging the coating unit in a first chamber;
 arranging the first reel and the second reel in a second chamber; and
 arranging the first chamber and the second chamber in operational connection together for moving the substrate and/or the interleave web between the first and the second chamber.

* * * * *